United States Patent
Uesaka et al.

(10) Patent No.: US 7,096,396 B2
(45) Date of Patent: Aug. 22, 2006

(54) TEST SYSTEM FOR CIRCUITS

(75) Inventors: Kouji Uesaka, Kawasaki (JP); Shuichi Kameyama, Kawasaki (JP); Takeshi Yanase, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 417 days.

(21) Appl. No.: 10/367,771

(22) Filed: Feb. 19, 2003

(65) Prior Publication Data
US 2003/0233208 A1 Dec. 18, 2003

(30) Foreign Application Priority Data
Feb. 19, 2002 (JP) .............................. 2002-041163

(51) Int. Cl.
*G01R 31/28* (2006.01)
(52) U.S. Cl. ..................... 714/725; 714/738
(58) Field of Classification Search .................. 703/24; 714/724, 725, 738; 438/149; 370/249; 365/201
See application file for complete search history.

(56) References Cited

U.S. PATENT DOCUMENTS

| | | | |
|---|---|---|---|
| 4,903,267 A | 2/1990 | Arai et al. | |
| 5,963,735 A * | 10/1999 | Sample et al. | ................. 703/24 |
| 6,044,481 A * | 3/2000 | Kornachuk et al. | ......... 714/724 |
| 6,202,182 B1 | 3/2001 | Abramovici et al. | |
| 6,400,173 B1 | 6/2002 | Shimizu et al. | |
| 6,436,741 B1 * | 8/2002 | Sato et al. | ................... 438/149 |
| 6,628,621 B1 * | 9/2003 | Appleton et al. | ........... 370/249 |
| 6,853,597 B1 * | 2/2005 | Jain | ............................ 365/201 |
| 2002/0171449 A1 | 11/2002 | Shimizu et al. | |
| 2004/0175850 A1 | 9/2004 | Shimizu et al. | |

FOREIGN PATENT DOCUMENTS

| | | |
|---|---|---|
| JP | 63-139266 | 6/1988 |
| JP | 6-180342 | 6/1994 |
| JP | 7-134160 | 5/1995 |
| JP | 10-96758 | 4/1998 |
| JP | 11-15740 | 1/1999 |
| JP | 2000-55990 | 2/2000 |
| JP | 2001-174522 | 6/2001 |
| JP | 2001-210685 | 8/2001 |

OTHER PUBLICATIONS

Office Action for corresponding Japanese Application No. 2002-041163 mailed Sep. 21, 2004.
Final Office Action for corresponding Japanese Application No. 2002-041163 mailed Oct. 4, 2005.

* cited by examiner

*Primary Examiner*—David Ton
(74) *Attorney, Agent, or Firm*—Staas & Halsey LLP

(57) ABSTRACT

A test system for circuits which is capable of selecting any one of a plurality of circuits to be tested and testing a selected circuit to be tested, includes a tested circuit data producing unit which produces tested circuit data concerning any one of several circuits to be tested; and a control unit which controls a plurality of programmable gate arrays (PGAs) on the basis of an output of the tested circuit data producing unit. Furthermore, the test system for circuits includes a plurality of PGAs each of which is connected to the control unit and generates a test pattern in response to control data sent from the control unit according to a program; and interface units which are associated with the plurality of PGAS, respectively, and are connected to the circuits to be tested.

19 Claims, 7 Drawing Sheets

Fig.3

TEST SYSTEM FOR CIRCUITS

BACKGROUND OF THE INVENTION

1. Field of the Invention

The present invention relates to a test system for various circuits. More particularly, the present invention relates to a test system, for various circuits, suitable for testing an integrated circuit memory device or the like.

2. Description of the Related Art

In the field of testing a memory device, a stored program method is normally adopted for a conventional test system that is a test system for circuits. Herein, for a better understanding of problems underlying conventional test systems for circuits, the configuration of a conventional test system, for circuits, adopting the stored program method and the operations thereof will be described in conjunction with FIG. 1, FIG. 2A and FIG. 2B that will be described in "Brief Description of the Drawings" later.

Figure 1:
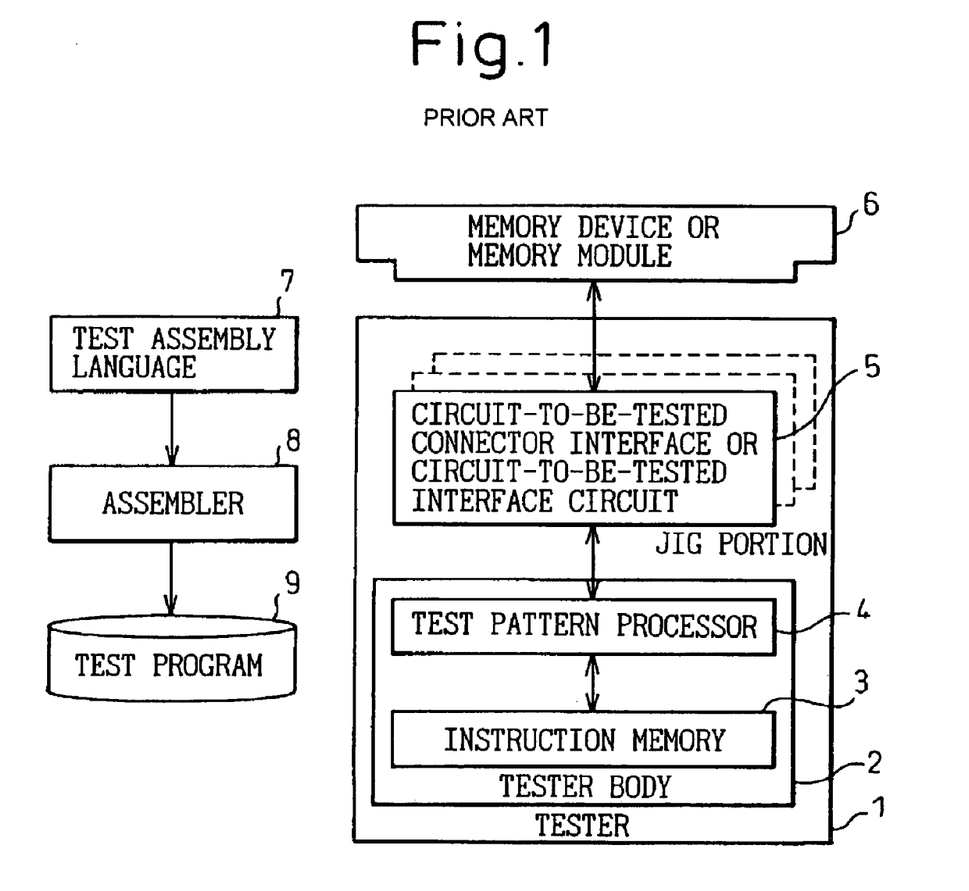
FIG. 1 is an explanatory diagram concerning a conventional stored program method.

An explanatory diagram concerning the conventional stored program method is illustrated in FIG. 1. Referring to FIG. 1, there are shown a tester 1, a tester body 2, an instruction memory 3, a test pattern processor 4, a jig portion 5 (or interface unit) through which an object to be tested and the tester are connected to each other, a memory device or memory module 6 that is an object to be tested, a test assembly language 7, an assembler 8, and a test program 9. The jig portion 5 consists of an object-to-be-tested connector interface or an object-to-be-tested interface circuit.

In the thus configured system, the test assembly language 7 is used to describe an algorithm for producing a test pattern. The assembler 8 assembles the algorithm, thus producing the test program 9. The test program 9 is stored in the instruction memory 3 included in the tester 1. The pattern processor 4 included in the tester reads out the stored test program from the instruction memory 3, and interprets what instruction is indicated by the read numerical values. Thus, the test pattern is produced.

A test signal having the produced test pattern is applied to the object to be tested 6 through the interface unit 5, in accordance with an access protocol defined exclusively for the object to be tested 6. Thereafter, the next instruction is read out from the instruction memory 3, and a series of operations, that is, interpretations and executions, are carried out repeatedly.

The above-mentioned sequence will be itemized in the form of the following steps.

(1) Down-loading the test program into the instruction memory (2) Starting a test (3) Reading out numerical values from the instruction memory (4) Interpreting what instruction, written in a machine language, is indicated by the numerical values (5) Executing the instruction (6) Transmitting an execution pattern to the interface circuit (7) Applying a test signal having the above pattern to the object to be tested 6 (memory device or memory module) through the interface circuit (8) Reading the next instruction from the instruction memory, and repeating the above steps (4) to (8)

(9) Completing the test

In the conventional stored program method, when the tester 1 executes one instruction described in a test program for the object to be tested, the steps of reading out the instruction memory 3, interpreting what instruction is indicated by the numerical value, and executing the instruction (usually referred to as a fetch cycle) must be carried out without fail. This situation remarkably affects the operating speed of a test system.

Moreover, a conventional test circuit system may adopt a method, of testing an object to be tested, by transferring a test pattern to the object to be tested by using a field programmable gate array (usually abbreviated to FPGA; a registered trademark granted to Zilinks Corporation). According to this method, program data is transferred to the FPGA so as to generate a predetermined test pattern that is used to test a circuit to be tested.

Whatever method may be adopted, a hardware architecture of a conventional system is fixed and, also, conditions for assignment of test signal components to pins of input and output ports are fixed. The arrangement of address lines and data lines varies depending on an object to be tested, while it is determined what signals are transferred through respectively corresponding pins in a tester. Therefore, the line connection between an object to be tested and an interface unit (jig portion) 5 is complicated. There is a disadvantage that the signal transmission lines cannot cope with high speed signals.

Figure 2A:
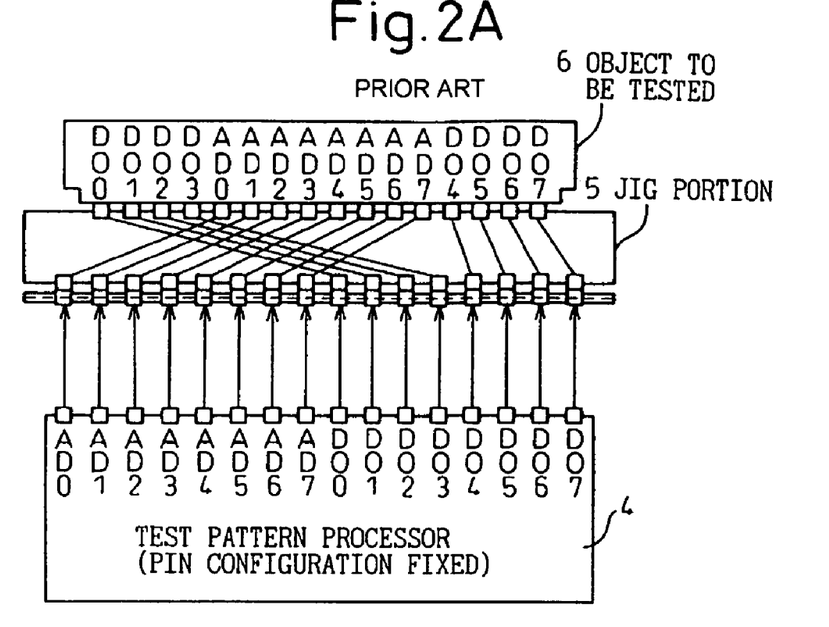
FIG. 2A shows a first example of a pin configuration of a conventional test system.
Figure 2B:
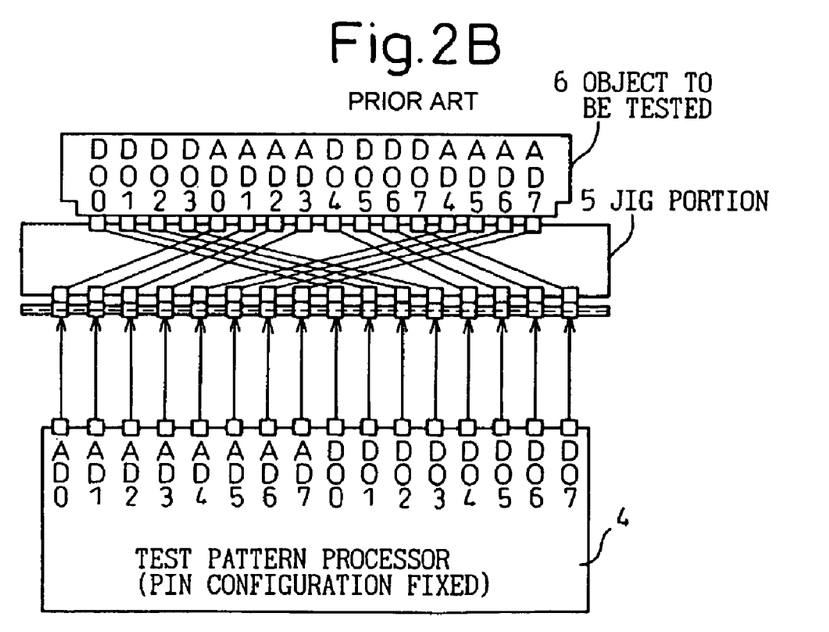
FIG. 2B shows a second example of a pin configuration of a conventional test system.

First and second examples of a pin configuration in a conventional test system, is illustrated in FIG. 2A and FIG. 2B. Herein, two examples are shown in FIG. 2A and FIG. 2B. In FIG. 2A and FIG. 2B, there is shown a test pattern processor 4 whose pin configuration is fixed. More specifically, address pins (AD0 to AD7) and data pins (DO0 to DO7) are juxtaposed in that order from left to right. The test pattern processor 4 and the object to be tested are connected to each other, through a jig portion 5. The pin configuration of the object to be tested 6 varies depending on the type of the object to be tested. In the first example shown in FIG. 2A, the data pins DO0 to DO3, address pins AD0 to AD7, and data pins DO4 to DO7 are juxtaposed in that order from left to right.

It is therefore impossible to directly connect the test pattern processor 4 to the object to be tested 6, by using a plurality of lines for connecting the test pattern processor 4 to the object to be tested 6 from the lower part to the upper part, without making these lines intersect with each other. The jig 5 is therefore used to adjust a difference concerning the pin configuration between the test pattern processor 4 and the object to be tested 6. The lines therefore intersect with each other on the jig portion 5.

On the other hand, in the second example shown in FIG. 2B, the pin configuration of the object to be tested 6 is more complicated than that in the first example shown in FIG. 2A. The pins DO0 to DO3, AD0 to AD3, DO4 to DO7, and AD4 to AD7 are juxtaposed in that order from left to right. The number of intersections of lines on the jig portion 5 is therefore larger than that shown in FIG. 2A.

In recent years, memory devices (modules) have come to require a complicated access protocol and operate at remarkably high speeds. A tester is therefore required to operate at higher speeds and cope with various complicated access protocols. Therefore, various attempts have been made to cope with these disadvantages. More specifically, a dedicated LSI has been developed in order to resolve a delay in the operation caused by a fetch cycle, or an interface has been incorporated into a tester in order to cope with various kinds of objects to be tested, or the interface, per se, has been included in a jig portion.

Not only a test system for testing a memory device but also the other various test systems have configurations in which the architecture of each tester is fixed. Each of the test systems cannot provide capabilities other than those defined by the determined architecture of the tester. For this reason, each of the test systems is designed to provide various capabilities from the beginning and are therefore complicated, relatively large in size, and expensive.

SUMMARY OF THE INVENTION

The present invention attempts to solve the foregoing problems. An object of the present invention is to provide a test system for circuits which is capable of selecting any one of a plurality of circuits to be tested and of testing the selected circuit to be tested.

In order to accomplish the above object, the present invention provides a test system for circuits comprising a tested circuit data producing unit for producing tested circuit data concerning any one of several circuits to be tested; a control unit for controlling a plurality of programmable gate arrays (usually abbreviated to PGAS) on the basis of an output of the tested circuit data producing unit; a plurality of PGAs each of which is connected to the control unit and generates a test pattern in response to control data sent from the control unit according to a program; and interface units which are associated with the plurality of PGAS, respectively, and are connected to the circuits to be tested.

Owing to the above configuration, tested circuit data can be transferred to a predetermined programmable gate array (usually abbreviated to PGA) in response to a command sent from the control unit, and a plurality of circuits to be tested can be tested mutually independently.

Moreover, the present invention provides a test system for circuits comprising a tested circuit data producing unit for producing tested circuit data concerning a circuit to be tested; a PGA for generating a test pattern on the basis of an output of the tested circuit data producing unit according to a program; and an interface unit connected to the PGA through one terminal thereof and connected to a plurality of circuits to be tested through the other terminal thereof.

Owing to the above configuration, a plurality of circuits can be tested through one PGA.

Preferably, in the test system for circuits according to the present invention, the PGA produces a test pattern using a hard-wired logic.

Owing to the above configuration, a plurality of circuits to be tested can be tested concurrently. In other words, a fetch cycle becomes unnecessary and high speed operations can be carried out.

Moreover, the present invention provides a test system for circuits comprising a host for controlling operations which are to be performed in the whole of the system, a test circuit which is connected to the host and in which tested circuit data is temporarily stored; a switching unit which is connected to the host and determines to which PGA the tested circuit data, received from the test circuit, should be handed over; a plurality of PGAs connected to the switch and also connected to associated circuits to be tested; and interfaces associated with the PGAs and connected to the circuits to be tested.

Owing to the above configuration, even when the circuits to be tested have different configurations, the PGAs are switched by using the switching unit and are able to generate different test patterns respectively corresponding to the different configurations. Consequently, all the different circuits to be tested can be tested.

Preferably, in the test system for circuits according to the present invention, data used to produce a test pattern can be described using an ordinary language or an ordinary circuit diagram.

Owing to the above configuration, a circuit to be tested can be tested easily.

More preferably, the test system for circuits according to the present invention is designed to include the interface unit in the PGA.

Owing to the above configuration, the interface unit, per se, can be compact because it has only a signal pattern formed thereon.

More preferably, the test system for circuits according to the present invention is designed to include the PGA in the interface unit.

Owing to the above configuration, a circuit to be tested can be driven directly by an output of the PGA. This results in high speed operations.

More preferably, in the test system for circuits according to the present invention, the tested circuit data producing unit is configured to function as a second PGA for dynamically reconstructing the PGA.

Owing to the above configuration, a test pattern used to test a circuit to be tested can be generated efficiently.

More preferably, in the test system for circuits according to the present invention, the PGA has a required delay programmed therein in consideration of a delay dependent on the number of logic memory cells.

Owing to the above configuration, a pattern of a test signal, which has undergone a predetermined delay and whose components are applied to predetermined pins of an output port, can be generated.

BRIEF DESCRIPTION OF THE DRAWINGS

The above object and features of the present invention will be more apparent from the following description of some preferred embodiments with reference to the accompanying drawings, wherein.

DESCRIPTION OF THE PREFERRED EMBODIMENTS

Hereinafter, the description of some preferred embodiments according to the present invention will be given with reference to the accompanying drawings.

Figure 3:
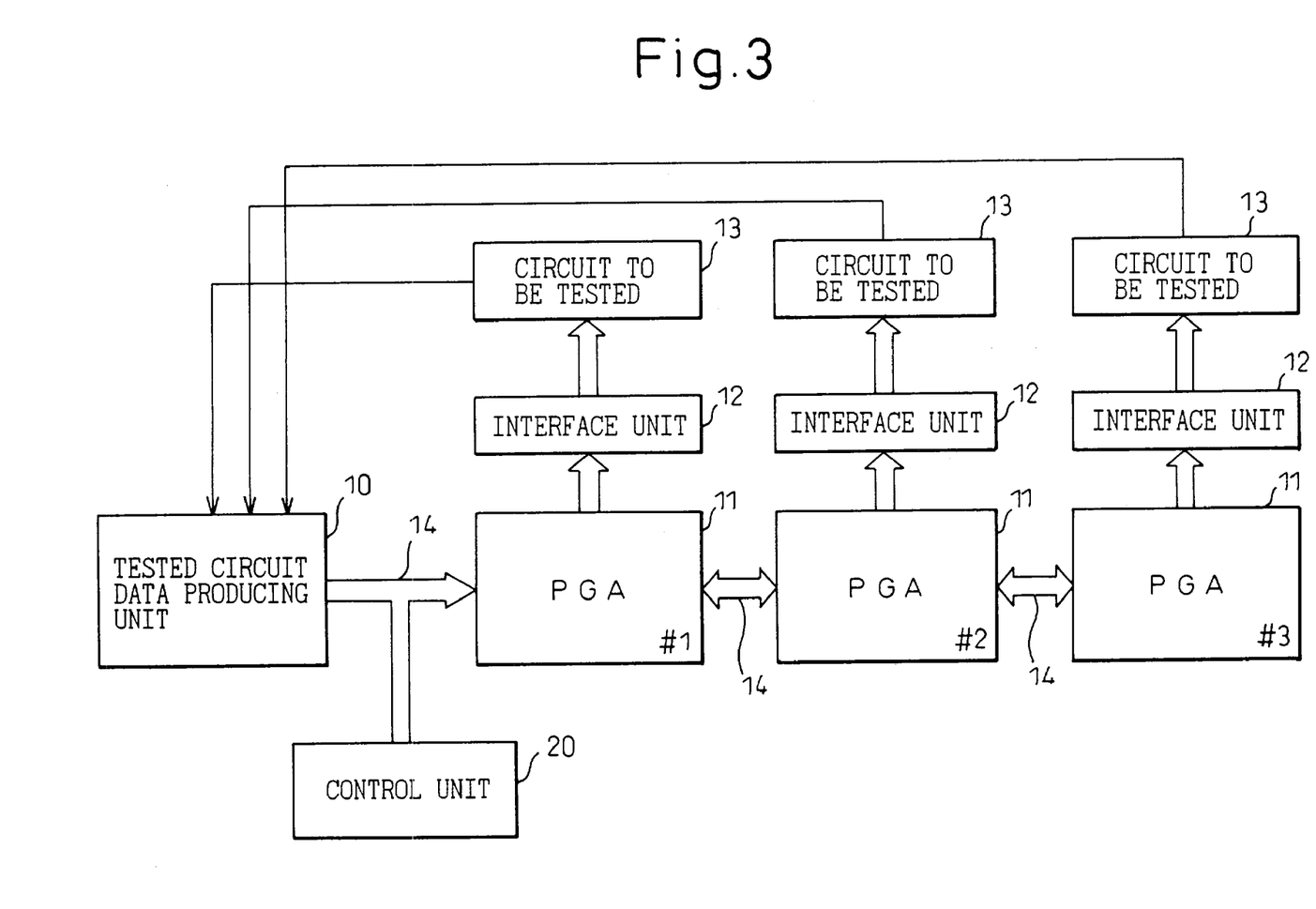
FIG. 3 is a block diagram showing a first embodiment of the present invention.

FIG. 3 is a block diagram showing a first embodiment of the present invention. Referring to the drawing, a tested circuit data producing unit 10 produces tested circuit data concerning a circuit to be tested. A control unit 20 controls the operations which are to be performed in the whole of a test system. For example, a CPU is adopted as the control unit 20. In general, the control unit 20 includes the tested circuit data producing unit 10 which produces tested circuit data, and a control host which controls the tested circuit data producing unit. Programmable gate arrays (PGAs) 11 are connected to the control unit 20 through a bus 14, and each of the PGAs generates a test pattern used to test a circuit to be tested. For example, field programmable gate arrays (usually abbreviated to FPGAs) manufactured by Zilink Corporation can be adopted as PGAs. The bus 14 consists of various signal lines for linking different components, such as a data line, a control signal line, a power supply line, and a timing signal line.

With regard to the PGAs 11, a plurality of PGAs (herein, three PGAs #1 to #3) is included as shown in FIG. 3. Interface units 12 are connected to the corresponding PGAs 11, respectively. Circuits to be tested 13 are connected to the corresponding interface units 12, respectively. As the circuits to be tested 13, typically, a memory card is adopted. Each circuit to be tested 13 transfers tested circuit information (for example, the number of pins) to the tested circuit data producing unit 10. According to the first embodiment, the PGAS 11, interfaces 12, and circuits to be tested 13 exist independently of each other (in parallel). The operations which are to be performed in the test system having the above-mentioned components will be described below.

The circuits to be tested 13 transfer tested circuit information to the tested circuit data producing unit 10. The tested circuit data producing unit 10 having received the tested circuit information produces tested circuit data that is used to test each circuit to be tested. The tested circuit data is transferred to the control unit 20. The control unit 20 receives the tested circuit data sent from the tested circuit data producing unit 10 and control information, and determines which of the circuits to be tested 13 should be tested. Once the circuit to be tested 13 is determined, the associated PGA is determined. Consequently, an enabling signal which is to be applied to the determined PGA 11 is activated, and enabling signals which are to be applied to the other PGAs 11 are inactivated.

Consequently, tested circuit data sent from the control unit 20 is transferred to the PGA 11 selected by the enabling signal. The PGA 11 generates a test pattern based on the received tested circuit data. A test signal having the test pattern is transmitted to the circuit to be tested 13 through the corresponding interface unit 12. The circuit to be tested 13 operates based on the test signal received through the corresponding interface unit 12. The results of the testing of the circuit to be tested 13 are transferred to the control unit 20 along a route that is not shown in FIG. 3.

The control unit 20 judges whether the circuit to be tested 13 is normal, or defective, on the basis of the results of the testing. If the results of the testing indicate that the circuit to be tested 13 is defective, the control unit 20 analyzes the defective data so as to find the cause of the defective operations of the circuit to be tested 13.

Thereafter, the tested circuit data producing unit 10 generates another tested circuit data. The tested circuit data is transferred to the control unit 20, together with a control signal. The control unit 20 selects a target PGA 11, and transfers the tested circuit data to the PGA 11. The PGA 11 having received the tested circuit data generates a test pattern based on the tested circuit data and transfers the test pattern to the circuit to be tested 13. Thereafter, the same operations as those described above are carried out.

A sequence employed in the present embodiment will be itemized in the form of the following steps.

(1) Down-loading tested circuit data to the target PGA 11

(2) Starting a test (3) Applying a test signal to the circuit to be tested 13 through the target PGA 11 and the corresponding interface unit 12, which are realized by means of hardware and which autonomously generate a pattern and the test signal having the pattern (4) Completing the test As mentioned above, according to the first embodiment, tested circuit data can be transmitted to a predetermined PGA 11 in response to a command sent from the control unit 20. In this embodiment, as the PGAs 11, the interface units 12, and circuits to be tested 13 are connected in parallel with each other, the circuits to be tested can operate in parallel. In this case, the control unit 20 transmits tested circuit data to the PGAS 11 in a time-sharing system. The plurality of circuits to be tested 13 can be tested independently of each other. Consequently, the circuits to be tested 13 may be mutually different circuits or may be mutually identical circuits such as memory cards. If the circuits to be tested are mutually identical, the PGAs 11 generate the same test patterns.

According to this embodiment, tested circuit data can be transmitted to a predetermined PGA 11 in response to a command sent from the control unit 20. The circuits to be tested 13 can be tested independently of each other.

Figure 4:
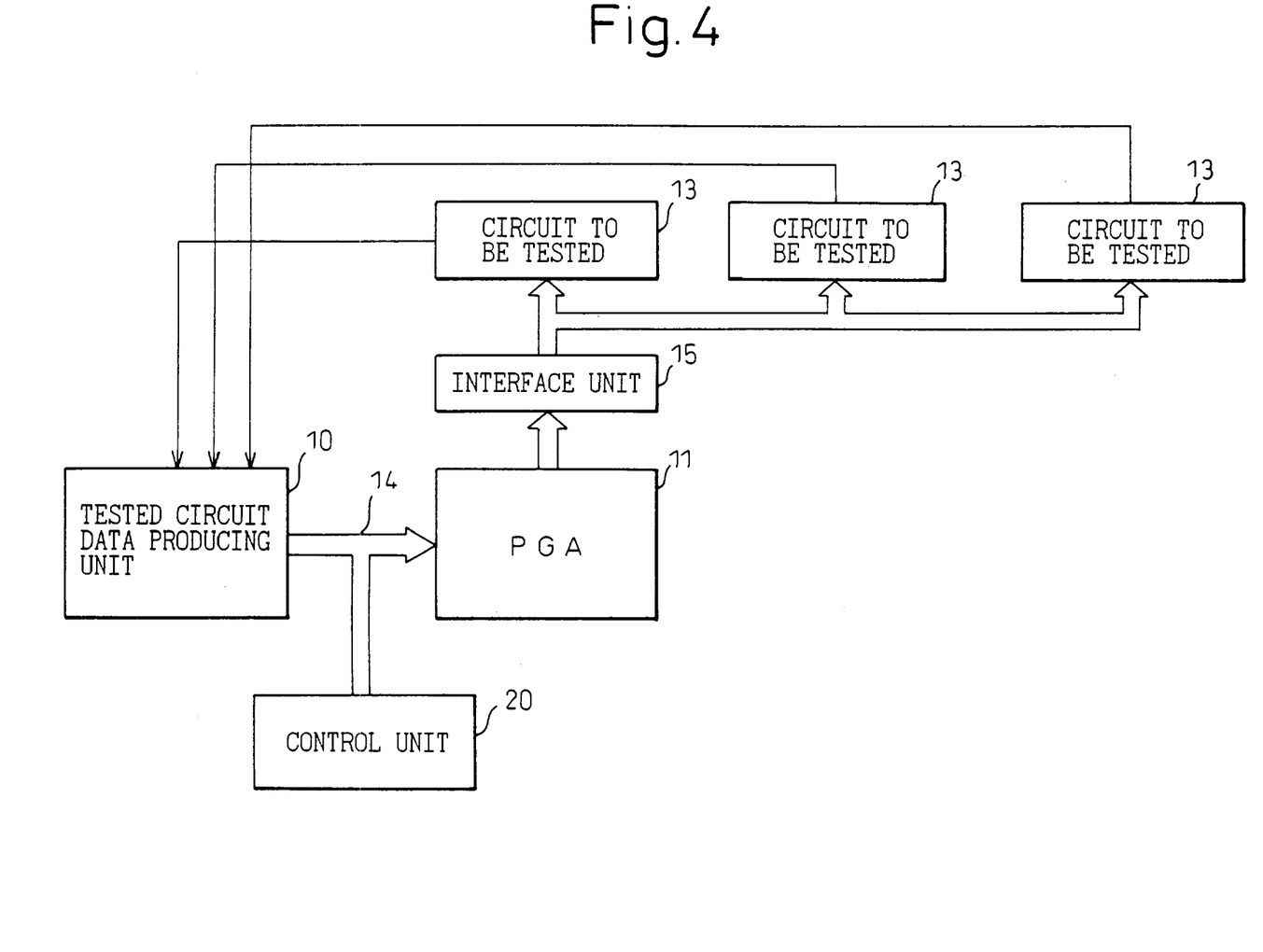
FIG. 4 is a block diagram showing a second embodiment of the present invention.

FIG. 4 is a block diagram showing a second embodiment of the present invention. Hereinafter, the same reference numerals will be assigned to the components identical to those described previously. Referring to FIG. 4, a tested circuit data producing unit 10 produces tested circuit data relevant to circuits to be tested 13. A programmable gate array (PGA) 11 receives the tested circuit data which is an output of the tested circuit data producing unit 10, and generates a test pattern. A test signal having the pattern is transmitted to the circuits to be tested 13.

An interface unit 15 receives the output of the PGA 11. The circuits to be tested 13 are connected to the interface 15. As the PGA 11, an FPGA as mentioned above is adopted. With regard to the circuits to be tested 13, a plurality of circuits to be tested (three circuits to be tested in FIG. 4) is included. A test signal having a produced pattern is transmitted to each of the circuits to be tested 13 through the interface unit 15. Moreover, each of the circuits to be tested 13 transmits circuit information relevant to each of the circuits to be tested (for example, a pin configuration and the number of pins) to the tested circuit data producing unit 10. The operations which are to be carried out in the test system having the above-mentioned components will be described below.

The circuits to be tested 13 transmit tested circuit information to the tested circuit data producing unit 10. The tested circuit data producing unit 10 having received the tested circuit information produces tested circuit data that is used to test a circuit to be tested. The tested circuit data is transmitted to the PGA 11. The PGA 11 receives the tested circuit data sent from the tested circuit data producing unit 10 and control information, and determines which of the circuits to be tested 13 should be tested. A PGA enabling signal which is to be applied to the determined circuit to be tested 13 is activated, while enabling signals which are to be applied to the other circuits to be tested 13 are inactivated.

Consequently, the tested circuit data produced by the tested circuit data producing unit 10 is transmitted to the PGA 11. The PGA 11 having received the tested circuit data generates a test pattern. A test signal having the pattern is then transmitted to be tested 13 via the interface unit 15. The circuit to be tested 13 operates based on the test signal received via the interface unit 15. The results of the testing of the circuit to be tested 13 are transmitted to the tested circuit data producing unit 10 along a route that is not shown in FIG. 3.

The tested circuit data producing unit 10 judges whether the circuit to be tested 13 is normal, or defective, on the basis of the results of the testing. If the results of the testing indicate that the circuit to be tested 13 is defective, the tested circuit data producing unit 10 analyzes the defective data so as to find the cause of the defective operations of the circuit to be tested 13.

Thereafter, the tested circuit data producing unit 10 produces another tested circuit data. The tested circuit data is transmitted to the PGA 11, together with a control signal. The PGA 11 selects a target circuit to be tested 13 and generates a test pattern according to the received tested circuit data. A test signal having the pattern is transmitted to the circuit to be tested 13. Thereafter, the same operations as those described above are carried out. Incidentally, if the circuits to be tested 13 are of the same type, the interface unit 15 is designed to be connected to the circuits to be tested 13 by means of a wired OR connection. Otherwise, the PGA may be designed to provide one logical output when receiving one logical input, and the circuits to be tested 13 may be designed to operate in parallel, in response to the logical output. In this case, the same test pattern can be transmitted to all the circuits to be tested 13.

According to this embodiment, data used to produce a test pattern can be described using an ordinary language or an ordinary circuit diagram. Each of the circuits to be tested can therefore be tested easily. Moreover, according to this embodiment, hard-wired logic is used to produce a test pattern. A fetch cycle therefore is not needed. The plurality of circuits to be tested 13 can be tested concurrently by using a hardware circuit configuration. Moreover, according to this embodiment, one PGA can be used to test a plurality of circuits to be tested.

Figure 5:
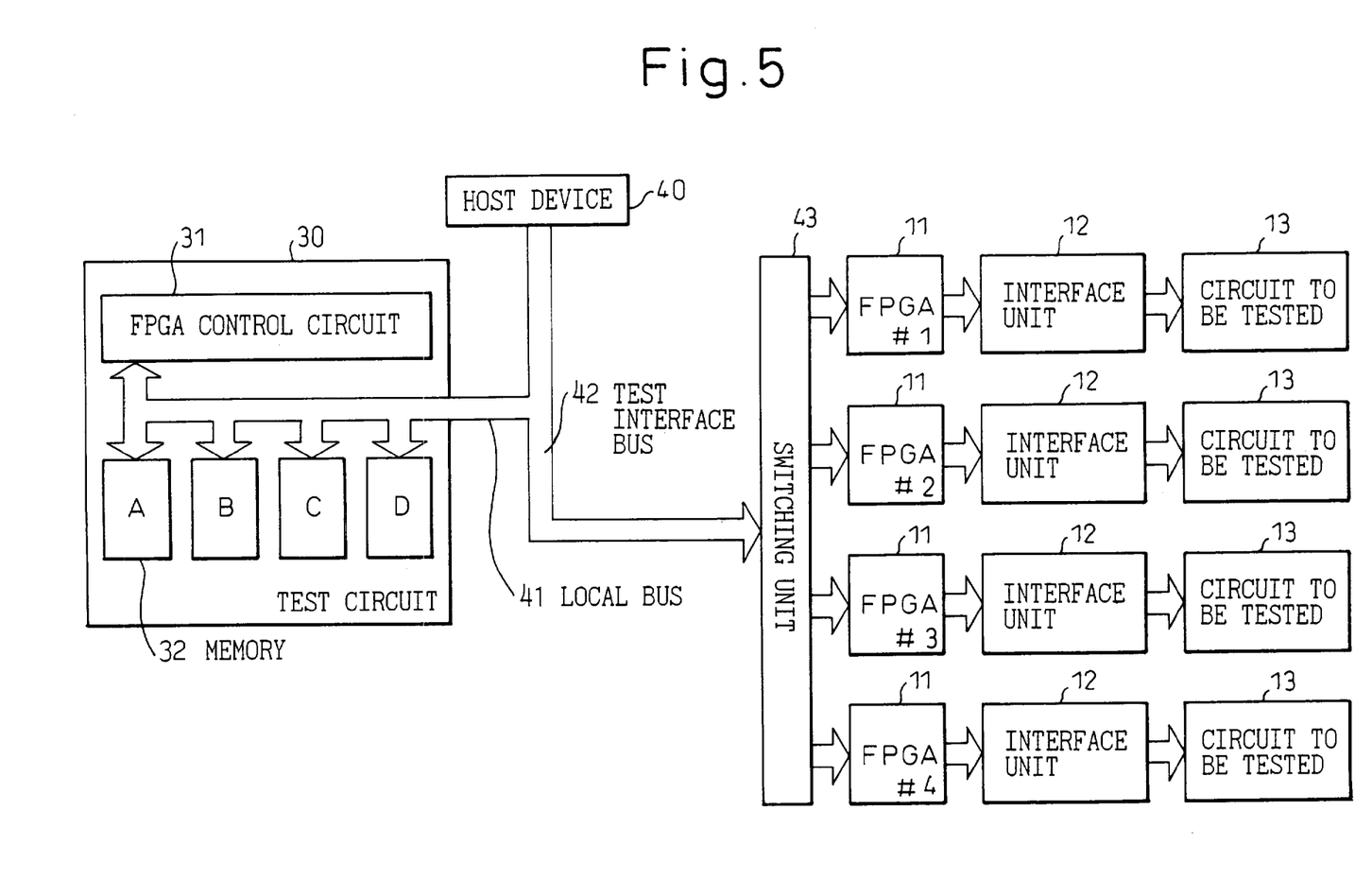
FIG. 5 is a block diagram showing a third embodiment of the present invention.

FIG. 5 is a block diagram showing a third embodiment of the present invention. Referring to FIG. 5, there are shown a host device 40, a local bus 41 which is connected to the host device 40 and a test interface bus 42 which is also connected to the host device 40. The buses 41 and 42 are each composed of a data line, a control signal line, a timing signal line and a power supply line. A test circuit 30 is connected to the local bus 41. The test circuit 30 includes an FPGA control circuit 31 and a memory 32. The FPGA control circuit 31 writes tested circuit data sent from the host device 40 in the memory 32, reads out tested circuit data from the memory 32, generates a control signal which instructs the FPGA control circuit 31 to reconstruct circuit data, and transmits the reconstructed circuit data read out from the memory 32.

A switching unit 43 is connected to the test interface bus 42 and switches FPGAs to select an FPGA which is to be employed. A plurality of FPGAs 11 serving as a plurality of PGAs are connected to the switching unit 43. Interface units 12 are associated with the FPGAs 11. Circuits to be tested 13 are associated with the interface units 12. Herein, four FPGAs 11 are included. The number of each of the interface units 12 and the circuits to be tested 13 are therefore also four, that is, the same as the number of the FPGAs 11. The operations which are to be carried out in the test system having the above-mentioned components will be described below.

Tested circuit data is transferred from the host device 40 to the test circuit 30 through the local bus 41. The transferred tested circuit data is temporarily stored in the memory 32. The FPGA control circuit 31 controls data storage. Herein, the memory 32 may be, as shown in FIG. 5, segmented into a plurality of portions A, B, C, and D in association with the circuits to be tested. In this case, the tested circuit data relevant to the circuits to be tested 13 can be stored in the respective corresponding portions.

Thereafter, the host device 40 issues a read instruction which instructs the reading of tested circuit data from the memory 32. The FPGA control circuit 31 makes access to the memory 32 to read desired tested circuit data. The read tested circuit data is transferred to the host device 40, and then transmitted to the switching unit 43 through the test interface bus 42.

At this time, tested circuit data transferred from the host device 40 contains data that specifies a given FPGA 11 which should be selected from a plurality of FPGAs. In response to a signal received from the host device, the switching unit 43 determines which of the FPGA 11 should be selected, and transmits the tested circuit data to the selected FPGA 11. For example, assuming that the FPGA 11 (#3) is designated, only the FPGA 11 (#3) is enabled and activated, and the other FPGAs are inactivated (disabled) but not activated.

Consequently, the tested circuit data is transferred to the FPGA 11 selected by the enabling signal. The selected FPGA 11 generates a test pattern according to the received tested circuit data. A test signal having the pattern is then transferred to the circuit to be tested 13 via the interface unit 12. The circuit to be tested 13 operates based on the test signal received through the interface unit 12. The results of the testing of the circuit to be tested 13 are transmitted to the host device 40 along a route that is not shown in FIG. 5.

The host device 40 judges whether the circuit to be tested 13 is normal, or defective, on the basis of the results of the testing. If the results of the testing indicate that the circuit to be tested is defective, the host device 40 analyzes the defective data and finds the cause of the defective operations of the circuit to be tested 13.

Thereafter, the test circuit 30 produces other tested circuit data. The host device 40 transmits the tested circuit data to the switching unit 43, together with a control signal. The switching unit 43 enables a designated FPGA 11 alone. The FPGA 11 having received the tested circuit data generates a test pattern according to the tested circuit data. A test signal having the pattern is then transferred to the circuit to be tested 13. Thereafter, the same operations as those described above are repeated. Incidentally, if tested circuit data to be transmitted from the host device 40 to the switching unit 43 is controlled by means of a time-sharing system, the four circuits to be tested 13 can be tested independently of each other. Moreover, if the four circuits to be tested 13 are mutually identical, test signals having the same pattern are transferred to the circuits to be tested 13 via the interface units 12.

As mentioned above, according to this embodiment, even if the circuits to be tested have different configurations, the switching unit 43 switches the FPGAs 11 which generate different test patterns. Therefore, any one of the circuits to be tested 13 can be selected, and the different circuits to be tested can be tested.

A description has been made regarding the case in which PGAs and interface units are included independently of each other. It should be noted that the present invention is not limited to this case. Alternatively, the PGAs and interface units may be integrated with each other.

For example, an interface unit may be incorporated in a PGA. In this case, the interface unit has only a signal pattern formed thereon. The interface unit can therefore be compact.

Moreover, a PGA may be incorporated in an interface unit. In this case, a circuit to be tested can be driven directly by an output of the PGA. This results in high speed operations.

Figure 6:
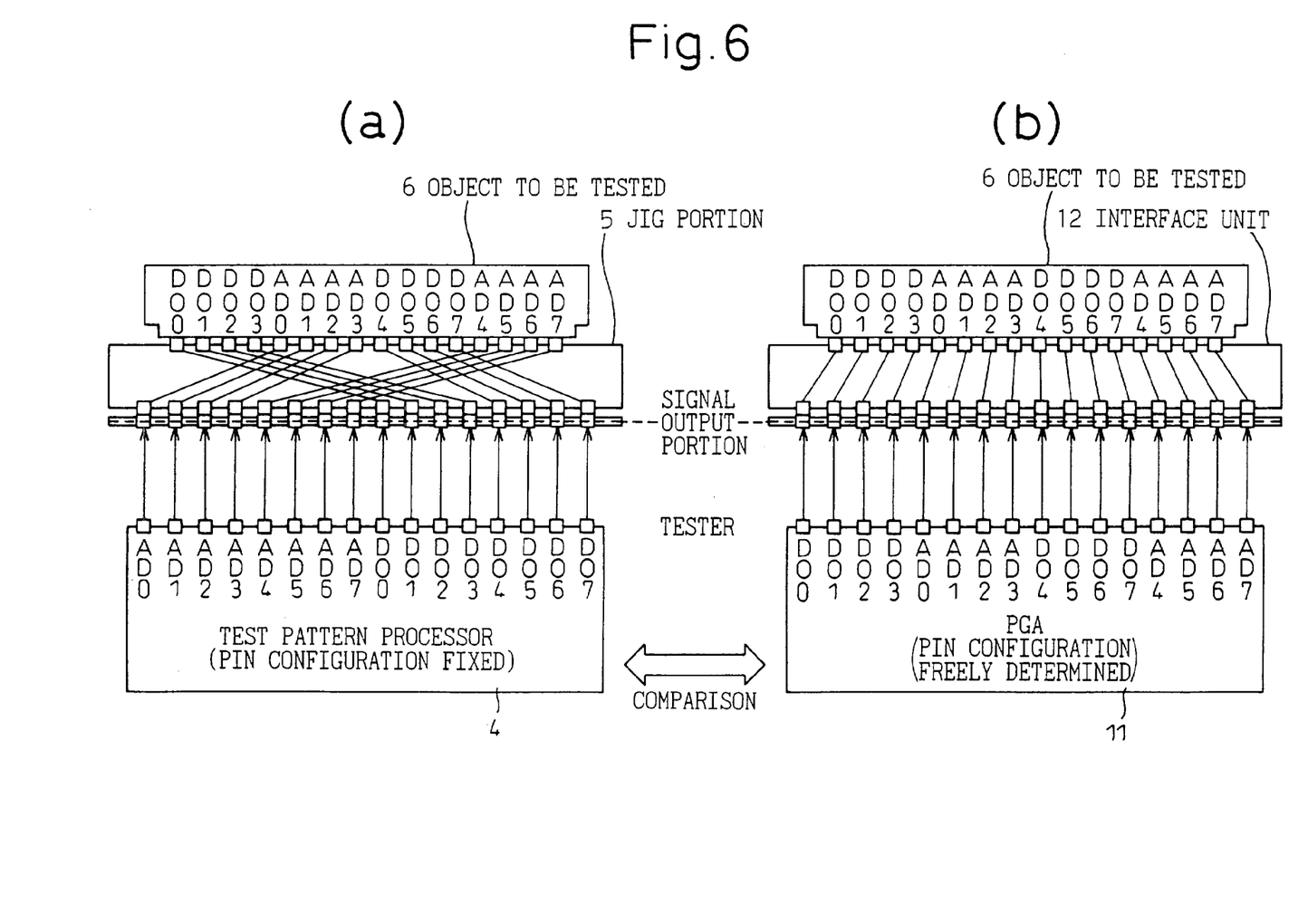
FIG. 6 is a diagram for comparing the pin configuration of the conventional test system with the pin configuration of a test system according to the present invention.

FIG. 6 is a diagram for comparing a pin configuration in a conventional test system with a pin configuration a test system according to the present invention. Portion (a) of FIG. 6 shows the pin configuration in the conventional test system, while portion (b) thereof shows the pin configuration of the test system according to the present invention. In the conventional test system, the configuration of the pins included in the output port of the test pattern processor 4 is fixed. In order to make the pin configuration in the object to be tested 6 conform to the pin configuration in the test pattern processor 4, the lines for linking the test pattern processor and object to be tested are intersected in the jig portion (interface unit) 5. This leads to many man-hours required for the line connection. Moreover, a high speed signal cannot be dealt with. In the test system according to the present invention, the configuration of pins in the output port of the PGA 11 can be determined freely. As shown in portion (b) of FIG. 6, the lines for connecting the PGA to the object to be tested are not intersected with each other in the interface unit 12. Only a few man-hours are therefore required for the line connection. Moreover, the line connection within the interface unit can be designed easily, the shortest lines are required for the line connection, and a delay in the transmission of a test signal can be reduced to minimum. This results in high speed operations.

Figure 7:
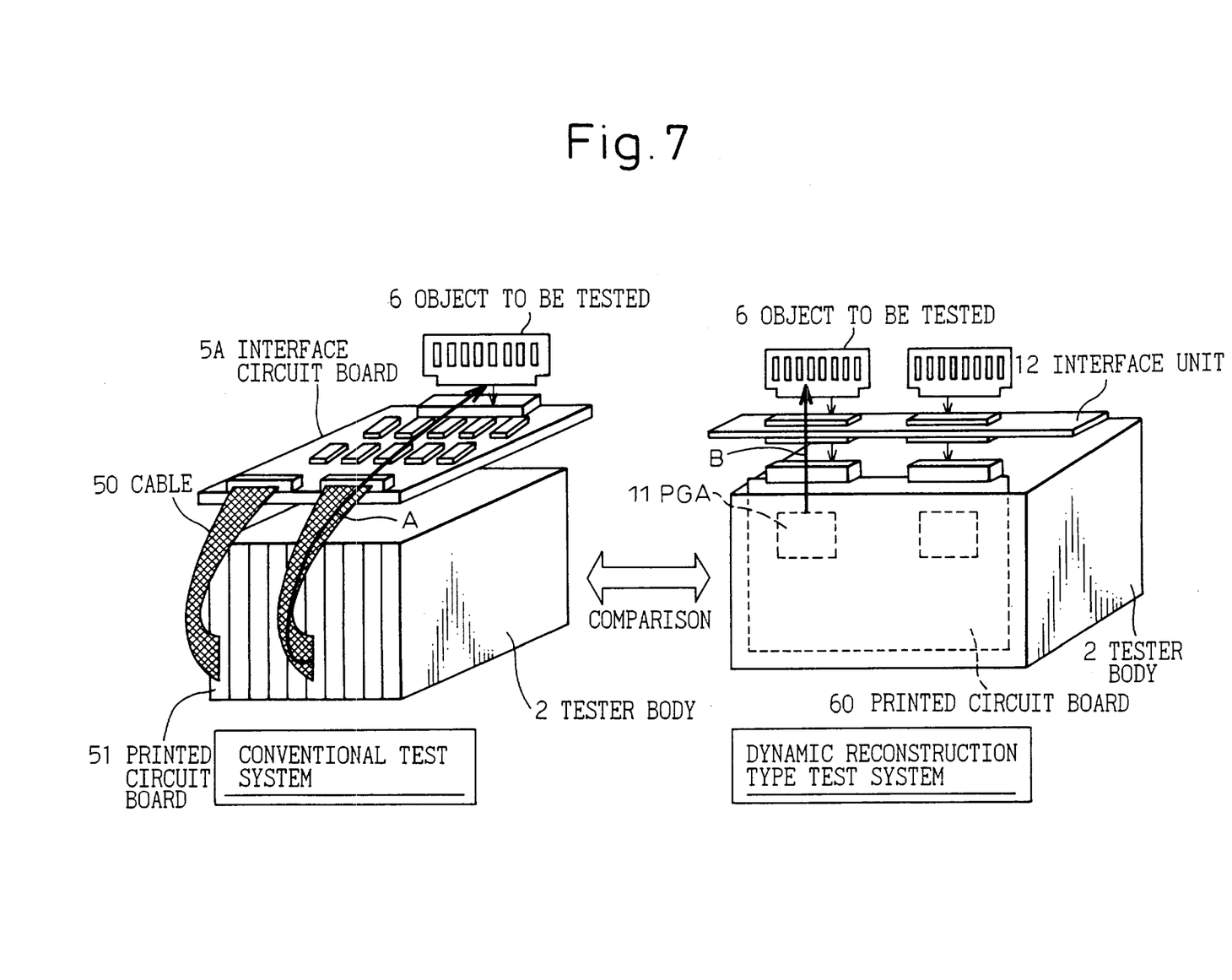
FIG. 7 is a diagram for comparing the appearance of the conventional test system with the appearance of the test system according to the present invention.

FIG. 7 is a diagram for comparing the appearance of a conventional test system with the appearance of the test system in accordance with the present invention. The appearance of the conventional test system is shown in the left-hand part of FIG. 7, while the appearance of the system according to the present invention is shown in the right-hand part thereof. In the conventional test system, a plurality of printed circuit boards 51 is incorporated in a tester body 2. An interface circuit card 5A is equivalent to a jig portion. The interface circuit card 5A and printed circuit boards 51 are connected with each other via a cable (or cables) 50. A route for transmitting the test signal is relatively long as indicated with arrow A in the drawing.

In contrast, in the test system according to the present invention, only one printed circuit board 60 is needed. The printed circuit board 60 is equivalent to the tested circuit data producing unit 10 shown in FIG. 3. The PGAs 11 are mounted in the printed circuit board 60. The PGAs are connected to a plurality of objects to be tested 6 via an interface unit 12. Herein, the distance between the PGA and each of the objects to be tested 6 can be the shortest as indicated with arrow B in the drawing. No cable is therefore needed, and it is easy to fabricate the test system, and the cost for fabricating the test system is remarkably reduced.

According to the present invention, the tested circuit data producing unit can be configured to function as a second PGA for dynamically reconstructing a PGA. Consequently, a test pattern which is used to test a circuit to be tested can be generated efficiently.

Moreover, according to the present invention, the PGA has a required delay programmed therein in consideration of a delay dependent on the number of logic memory cells. For example, assuming that a delay time which one gate requires to pass a signal through the gate is $\Delta t$ and the number of all the gates through which a signal must pass to undergo a required delay is n, the required delay time, $\delta T$, is expressed as follows:

$$\delta T = n \times \Delta t$$

Thus, a predetermined delay time can be obtained easily. A pattern of a test signal, which undergoes the predetermined delay and whose components are applied to predetermined pins of an output port, can be generated.

In each of the above-mentioned embodiments, a memory an object to be tested. It should be noted that the present invention is not limited to the memory device but can be applied to an integrated circuit including any other logical circuit.

As mentioned above, a PGA is adopted in the main part of a test system. Therefore, a minimum necessary access protocol and a minimum necessary algorithm can be incorporated into the test system. As hard-wired logic is used to produce a test pattern, a fetch cycle is not needed. A test can be achieved at the highest speed offered by a dynamically reconstructed device, which is to be employed.

According to the present invention, an interface circuit can be included in a test circuit. This obviates the necessity of developing an interface circuit which had to be developed for each model of a conventional test system. Consequently, the expense for developing a test system and the man-hours required for development can be minimized. Moreover, when the test circuit (interface circuit) is designed exclusively for the model of an object to be tested, not only an object to be tested that requires a general-purpose access protocol, but also an object to be tested that has been developed for a special purpose of use, can be tested easily.

According to a conventional testing procedure, a dedicated test system must be prepared for each type of test. Therefore, the cost for the testing procedure has become relatively high. According to the present invention, a facility including PGAs is employed. The PGAs have only to be reconstructed, on the basis of tested circuit data items that are developed in compliance with tests that are to be carried out, such as, a memory test, a function test, and a boundary scan test. Thus, various testers can be realized. Eventually, conventional high-performance large-scale expensive dedicated testers can be replaced with a high-performance small-scale inexpensive general-purpose tester.

As described above, some preferred embodiments of the present invention provide advantages described below.

(1) Tested circuit data can be transmitted to a predetermined PGA in response to a command sent from a control unit. Consequently, a plurality of circuits to be tested can be tested independently of each other.

(2) One PGA is used to test a plurality of circuits to be tested.

(3) A plurality of circuits to be tested can be tested concurrently. In other words, a fetch cycle is not needed and high speed operations can be achieved.

(4) Circuits to be tested may have different configurations. Nevertheless, since PGAs are switched by using a switching unit and are able to produce different test patterns, different circuits to be tested can be tested.

(5) A circuit to be tested can be tested easily.

In summary, according to the preferred embodiments of the present invention, there is provided a test system for circuits which is capable of selecting and testing any one of a plurality of circuits to be tested.

The invention claimed is:

1. A test system for circuits comprising:
   a tested circuit data producing unit for producing tested circuit data concerning any one of several circuits to be tested;
   a control unit for controlling a plurality of programmable gate arrays on the basis of an output of said tested circuit producing unit;
   a plurality of programmable gate arrays each of which is connected to said control circuit and generates a test pattern in response to control data sent from said control unit according to a program; and
   interface units which are associated with said plurality of programmable gate arrays, respectively, and are connected to said circuits to be tested.

2. A test system for circuits according to claim 1, wherein data used to produce a test pattern can be described using an ordinary language or a circuit diagram.

3. A test system for circuits according to claim 1, wherein an interface is included in a programmable gate array.

4. A test system for circuits according to claim 1, wherein a programmable gate array is included in an interface.

5. A test system for circuits according to claim 1, wherein said tested circuit data producing unit is configured to function as a second programmable gate array for dynamically reconstructing a programmable gate array.

6. A test system for circuits according to claim 1, wherein a programmable gate array has a required delay programmed therein in consideration of a delay dependent on the number of logic memory cells.

7. A test system for circuits comprising:
   a tested circuit data producing unit for producing tested circuit data concerning a circuit to be tested;
   a programmable gate array for generating a test pattern on the basis of an output of said tested circuit data producing unit according to a program; and
   an interface connected to said programmable gate array through one terminal thereof and connected to a plurality of circuits to be tested through the other terminal thereof.

8. A test system for circuits according to claim 7, wherein data used to produce a test pattern can be described using an ordinary language or circuit diagram.

9. A test system for circuits according to claim 7, wherein said programmable gate array realizes a production of a test pattern using a hard-wired logic.

10. A test system for circuits according to claim 9, wherein data used to produce a test pattern can be described using an ordinary language or circuit diagram.

11. A test system for circuits according to claim 7, wherein said interface is included in said programmable gate array.

12. A test system for circuits according to claim 7, wherein said programmable gate array is included in said interface.

13. A test system for circuits according to claim 7, wherein said tested circuit data producing unit is configured to function as a second programmable gate array for dynamically reconstructing a programmable gate array.

14. A test system for circuits according to claim 7, wherein said programmable gate array has a required delay programmed therein in consideration of a delay dependent on the number of logic memory cells.

15. A test system for circuits comprising:
   a host for controlling operations which are to be performed in the whole of said test system;
   a test circuit which is connected to said host and in which tested circuit data is temporarily stored;
   a switching unit which is connected to said host and determines to which programmable gate arrays tested circuit data, received from said test circuit, should be handed over;
   a plurality of programmable gate arrays which are connected to said switching unit and connected to respectively corresponding circuits to be tested; and
   interface units which are associated with said programmable gate arrays, respectively, and connected to said circuits to be tested.

16. A test system for circuits according to claim 15, wherein data used to produce a test pattern can be described using an ordinary language or circuit diagram.

17. A test system for circuits according to claim 15, wherein an interface is included in a programmable gate array.

18. A test system for circuits according to claim 15, wherein a programmable gate array is included in an interface.

19. A test system for circuits according to claim 15, wherein a programmable gate array has a required delay programmed therein in consideration of a delay dependent on the number of logic memory cells.

* * * * *